US009762253B2

(12) United States Patent
Huang et al.

(10) Patent No.: US 9,762,253 B2
(45) Date of Patent: Sep. 12, 2017

(54) REFERENCE FREQUENCY CALIBRATION MODULE AND APPARATUS USING THE SAME

(71) Applicant: C-MEDIA ELECTRONICS INC., Taipei (TW)

(72) Inventors: Chih-Ying Huang, Taipei (TW); Po-Shu Lan, New Taipei (TW)

(73) Assignee: C-MEDIA ELECTRONICS INC., Taipei (TW)

( * ) Notice: Subject to any disclaimer, the term of this patent is extended or adjusted under 35 U.S.C. 154(b) by 303 days.

(21) Appl. No.: 14/659,233

(22) Filed: Mar. 16, 2015

(65) Prior Publication Data

US 2016/0126964 A1     May 5, 2016

(30) Foreign Application Priority Data

Nov. 5, 2014   (TW) .............................. 103138390 A

(51) Int. Cl.
| | |
|---|---|
| *H03L 7/197* | (2006.01) |
| *H03L 7/23* | (2006.01) |
| *H03L 7/08* | (2006.01) |
| *G06F 1/04* | (2006.01) |
| *G06F 1/08* | (2006.01) |
| *G06F 1/10* | (2006.01) |

(Continued)

(52) U.S. Cl.
CPC .............. *H03L 7/1974* (2013.01); *G06F 1/04* (2013.01); *G06F 1/08* (2013.01); *G06F 1/10* (2013.01); *G06F 13/4282* (2013.01); *H03L 7/083* (2013.01); *H03L 7/1976* (2013.01); *H03L 7/235* (2013.01)

(58) Field of Classification Search
CPC ..... H03L 7/1974; H03L 7/235; H03L 7/1976; H03L 7/083; G06F 13/4282; G06F 1/04; G06F 1/08; G06F 1/10
See application file for complete search history.

(56) References Cited

U.S. PATENT DOCUMENTS

| | | | | |
|---|---|---|---|---|
| 3,805,192 | A | * 4/1974 | Ocnaschek | ............. H03L 7/197 331/25 |
| 4,893,271 | A | * 1/1990 | Davis | ........................ G06F 1/08 365/227 |
| 6,833,764 | B1 | 12/2004 | Dean | |

(Continued)

*Primary Examiner* — Stefan Stoynov
(74) *Attorney, Agent, or Firm* — Li & Cai Intellectual Property (USA) Office

(57) ABSTRACT

A reference frequency calibration module is provided. The reference frequency calibration module includes an oscillator, a frequency divider, a phase-locked loop (PLL) and a frequency-offset calibration unit. The frequency divider couples to the oscillator. The phase-locked loop couples to the frequency divider. The frequency-offset calibration unit couples to the frequency divider and the phase-locked loop. The oscillator is configured for operatively generating an oscillating signal having an oscillating frequency. The frequency divider divides the oscillating signal having the oscillating frequency by a first division parameter to generate a first clock signal having a first reference frequency. The phase-locked loop generates a second clock signal having a second reference frequency according to the first clock signal. The frequency-offset calibration unit is configured for operatively generating the first division parameter according to the second clock signal.

17 Claims, 6 Drawing Sheets

(51) Int. Cl.
      *G06F 13/42*      (2006.01)
      *H03L 7/083*      (2006.01)

(56) References Cited

U.S. PATENT DOCUMENTS

| | | | |
|---|---|---|---|
| 7,391,270 B2 * | 6/2008 | Neurauter | H03L 7/1974 327/156 |
| 7,898,343 B1 | 3/2011 | Janesch | |
| 8,675,665 B2 | 3/2014 | Umayabashi et al. | |
| 8,791,734 B1 | 7/2014 | Hara et al. | |
| 2013/0103969 A1 * | 4/2013 | Wang | G06F 1/12 713/502 |
| 2014/0152354 A1 * | 6/2014 | McLeod | H03B 19/00 327/117 |

* cited by examiner

REFERENCE FREQUENCY CALIBRATION MODULE AND APPARATUS USING THE SAME

BACKGROUND

1. Technical Field

The present disclosure relates to a reference frequency calibration module, in particular to a reference frequency calibration module with crystal-less and apparatus using the same.

2. Description of Related Art

Currently, the universal serial bus (USB) is a general transmission interface in the computer system or portable electronic device. The connection mode of the USB is amiable to user and the speed of the USB is fast, thus the USB has gradually become the standard of the transmission interface. The connection interface of each electronic apparatus mainly applies the USB to connect with the computer system, such as portable communication device, reader, keyboard, or mouse, etc.

In practice, a reference frequency is required to be a clock reference criterion of the operating system in the communication system. Generally, the transmission frequency of the USB needs to satisfy the requirement such as low jitter, high frequency accuracy, unchanged with supply voltage and the temperature variation. Therefore, the traditional electronic apparatus usually generates the stable frequency (about 50 ppm frequency error) by cooperates with the active oscillator or the passive crystal, so as to cause the cost and circuit area of the electronic apparatus raising.

SUMMARY

An exemplary embodiment of the present disclosure provides a reference frequency calibration module. The reference frequency calibration module includes an oscillator, a frequency divider, a phase-locked loop (PLL) and a frequency-offset calibration unit. The frequency divider couples to the oscillator. The phase-locked loop couples to the frequency divider. The frequency divider and the phase-locked loop couple to the frequency-offset calibration unit. The oscillator is configured for operatively generating an oscillating signal having an oscillating frequency. The frequency divider divides the oscillating signal having the oscillating frequency by a first division parameter to generate a first clock signal having a first reference frequency. The phase-locked loop generates a second clock signal having a second reference frequency according to the first clock signal. The frequency-offset calibration unit is configured for operatively generating the first division parameter according to the second clock signal.

An exemplary embodiment of the present disclosure provides an electronic apparatus. The electronic apparatus includes a reference frequency calibration module and a system frequency unit. The reference frequency calibration module includes an oscillator, a frequency divider, a phase-locked loop (PLL) and a frequency-offset calibration unit. The system frequency unit couples to the reference frequency calibration module. The frequency divider couples to the oscillator. The phase-locked loop couples to the frequency divider. The frequency divider and the phase-locked loop couple to the frequency-offset calibration unit. The oscillator is configured for operatively generating an oscillating signal having an oscillating frequency. The frequency divider divides the oscillating signal having the oscillating frequency by a first division parameter to generate a first clock signal having a first reference frequency. The phase-locked loop generates a second clock signal having a second reference frequency according to the first clock signal. The frequency-offset calibration unit is configured for operatively generating the first division parameter according to the second clock signal. The system frequency unit is configured for performing signal synchronization according to the second reference frequency having the second clock signal outputted from the reference frequency calibration module.

To sum up, the reference frequency calibration module and the apparatus provided by the present disclosure find it unnecessary to utilize the external reference frequency to be the clock criterion of the operating system. More specifically, the embodiment of the present disclosure utilizes an adjusted frequency divider to regulate an output signal of oscillated circuit. Thus, comparing with the traditional clock reference frequency module using the passive crystal component or the active oscillator, the embodiment of the present disclosure can utilize the oscillator circuit produced by the complementary metal oxide semiconductor (CMOS), to effectively save the external component, and reduce the circuit area and the cost thereof.

In order to further understand the techniques, means and effects of the present disclosure, the following detailed descriptions and appended drawings are hereby referred to, such that, and through which, the purposes, features and aspects of the present disclosure can be thoroughly and concretely appreciated, however, the appended drawings are merely provided for reference and illustration, without any intention that they be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
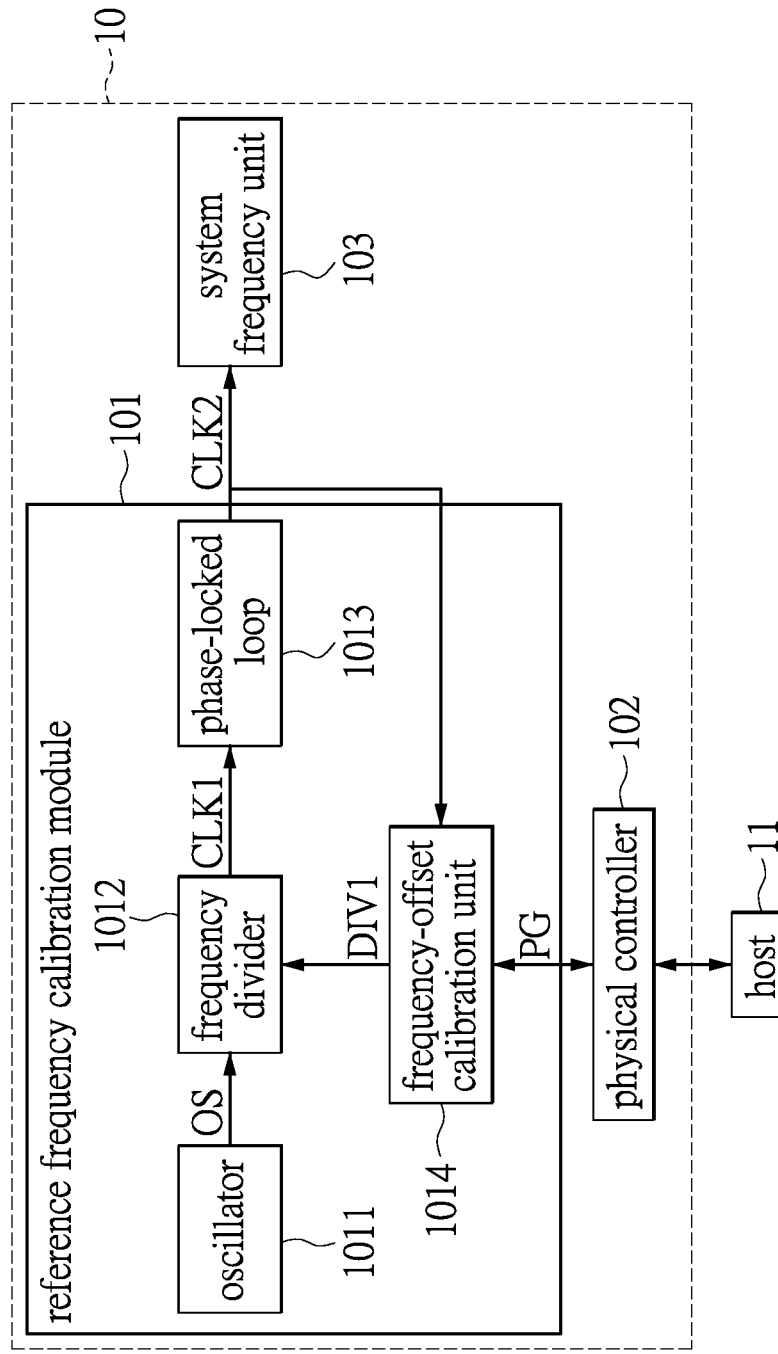
FIG. 1 is a diagram of a reference frequency calibration system of an embodiment according to the present disclosure.

Reference will now be made in detail to the exemplary embodiments of the present disclosure, examples of which are illustrated in the accompanying drawings. However, they may be embodied in different forms and should not be construed as limited to the embodiments set forth herein. In the drawings, the thickness and relative thickness of layers and regions may be exaggerated for clarity. Wherever possible, the same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of the embodiments. As used herein, the term "or" includes any and all combinations of one or more of the associated listed items.

Please refer to FIG. 1, FIG. 1 is a diagram of a reference frequency calibration system of an embodiment according to the present disclosure. The reference frequency calibration system 1 includes an electronic apparatus 10 and a host 11. The electronic apparatus 10 includes a reference frequency calibration module 101, a physical controller 102 and a system frequency unit 103. The reference frequency calibration module 101 includes an oscillator 1011, a frequency divider 1012, a phase-locked loop 1013 and a frequency-offset calibration unit 1014. The electronic apparatus 10 couples to the host 11. The physical controller 102 couples to the reference frequency calibration module 101, and the reference frequency calibration module 101 couples to the system frequency unit 103. The frequency divider 1012 couples to the oscillator 1011. The phase-locked loop 1013 couples to the frequency divider 1012. In the embodiment, the host 11 is a general computer system or portable electronic device, configured to perform the interchanging of the transmission data PG with the electronic apparatus 10.

In the embodiment of the present disclosure, the physical controller 102 is configured to provide a digital or analog interface module. Specifically, the physical controller 102 controls the bit stream of uplink or downlink over a physical media, the physical controller 102 exits in USB, optical fibers, cables, computer networking or even the part of wireless radio frequency, mixed signal, and analog.

the reference frequency calibration module 101 is configured to provide a second clock signal CLK2 required by the system frequency unit 103 of the electronic apparatus 10 or other circuit component for performing signal synchronization, to guarantee the transmission data PG (includes the voice data or other digital data) interchanged between the physical controller 102 and the host 11 being stably in transmission and avoid causing error of transmission data PG.

The oscillator 1011 is configured to generate an oscillating signal OS having a fixed oscillating frequency but may varied with the temperature, supply voltage and manufacture process. The second clock signal CLK2 is generated from the PLL 1013 with the first clock signal CLK1. As a result, the second clock signal CLK2 and the first clock signal CLK1 are in synchronous relationship. In the embodiment of the present disclosure, the oscillator 1011 is implemented by the all-silicon complementary metal oxide semiconductor (CMOS). In detail, the oscillator 1011 is a crystal-free oscillator, and the frequency of the oscillator 1011 operates in the range from 10 Mega Hz to 10 Giga Hz. Very often, the LC oscillator with Giga Hz oscillating frequency is employed due to high stability. Notably, the crystal-free oscillator is self-contained and does not require the external component, thus the cost and circuit area of the electronic apparatus using the crystal-free oscillator of the embodiment can be reduced effectively to compare with the traditional electronic apparatus using the crystal oscillator.

The frequency divider 1012 is configured to receive the oscillating signal OS outputted by the oscillator 1011, and further generate first clock signal CLK1 having a first reference frequency by dividing the oscillating signal OS with a first division parameter DIV1, then generate the second clock CLK2 via the phase-locked loop 1013. In other words, the reference frequency calibration module 101 can perform fine-tuning of the system reference frequency in operation, to achieve the expected goal for the system. Therefore, by the fine-tuning, the reference frequency calibration module 101 of the embodiment of the present disclosure does not need to utilize the accurate crystal oscillator to be as the oscillator 1011 generating the oscillator signal OS. Notably, in the embodiment of the present disclosure, the frequency divider 1012 is a high resolution fractional-N divider, which can regulate the frequency calibration in more accurately, so each moving of the frequency calibration can be minimized. However, the embodiment of the present disclosure is merely illustrated by the fractional-N divider, there is not limited the type of the frequency divider 1012 thereto.

The phase-locked loop 1013 is configured to generate the second clock signal CLK2 according to the first clock signal CLK1 outputted from the frequency divider 1012, and provides the second clock signal CLK2 to the frequency-offset calibration unit 1014. In the embodiment of the present disclosure, the phase-locked loop 1013 may provide the second clock signal CLK2 to be the system reference frequency to synchronize the system frequency unit 103, and provide the second clock signal CLK2 to the frequency-offset calibration unit 1014 to perform the frequency-offset regulating or calibration. That is, the system frequency unit 103 performs a signal synchronization according to the second reference frequency CLK2 having the second clock signal. However, although this is illustrated by the phase-locked loop 1013 in the embodiment of the present disclosure, the persons skilled in the art should know that the phase-locked loop 1013 can be an optional component, and this is not limited thereto.

Figure 2:
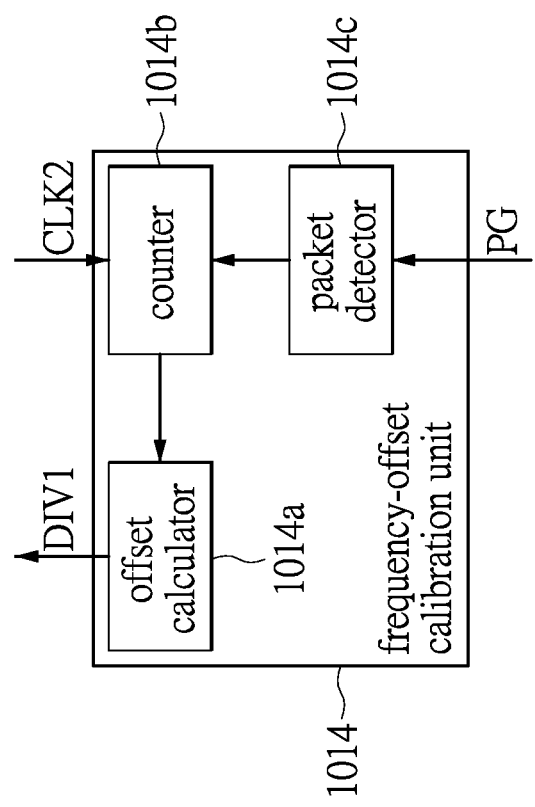
FIG. 2 is a detail diagram of a frequency-offset calibration unit of the embodiment according to the present disclosure.

The frequency-offset calibration unit 1014 calibrates the first clock signal CLK1 by the first division parameter DIV1 generated from the second clock signal CLK2 of the phase-locked loop 1013. Please refer to FIG. 1 in conjunction with FIG. 2, the frequency-offset calibration unit 1014 includes an offset calculator 1014a, a counter 1014b and a packet detector 1014c. The offset calculator 1014a and the packet detector 1014c couple to the counter 1014b.

The packet detector 1014c including suitable logic, circuitry, and/or code, is configured to detect a predetermined packet. More specifically, in the reference frequency calibration, the host 11 transmits the correct length of the transmission data PG (i.e., predetermined packet) to the physical controller 102. The packet detector 1014c detects the physical controller 102 receiving the transmission data PG.

Figure 3:
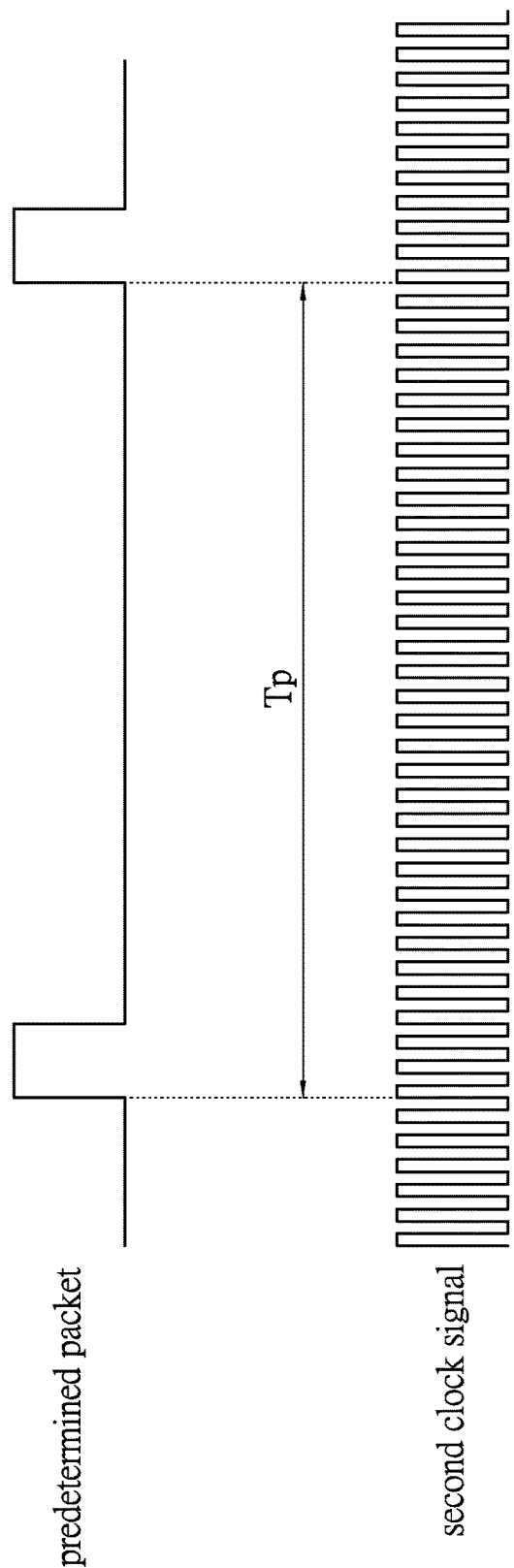
FIG. 3 is a sampling detection diagram of the frequency-offset calibration unit of the embodiment according to the present disclosure.

The counter 1014b including suitable logic, circuitry, and/or code, is configured to sample a length of the correct length of the transmission data PG by the second clock signal CLK2. Please refer to FIG. 3, FIG. 3 is a sampling detection diagram of the frequency-offset calibration unit of the embodiment according to the present disclosure. In detail, the counter 1014b samples the unknown length of the correct length of the predetermined packet by the second clock signal CLK2 outputted from the phase-locked loop 1013, to calculate the length of the predetermined packet. Shown as FIG. 3, the length of the predetermined packet is packet cycle $T_P$.

The offset calculator 1014a including suitable logic, circuitry, and/or code, is configured to generate the first division parameter DIV1 while the length (i.e., packet cycle $T_P$) of the predetermined packet sampled by the counter 1014b is not equal to a predetermined value or a predetermined range (e.g., 12000 times or 12000±1% times), and provide the first division parameter DIV1 to the frequency divider 1012. More specifically, if the length of the predetermined packet sampled by the counter 1014b is greater than the predetermined value, the offset calculator 1014a generates the first division parameter DIV1 for reducing the first reference frequency of the first clock signal CLK1; if the length of the predetermined packet sampled by the counter 1014b is less than the predetermined value, the offset calculator 1014a generates the first division parameter DIV1 for raising the first reference frequency of the first clock signal CLK1.

Figure 4:
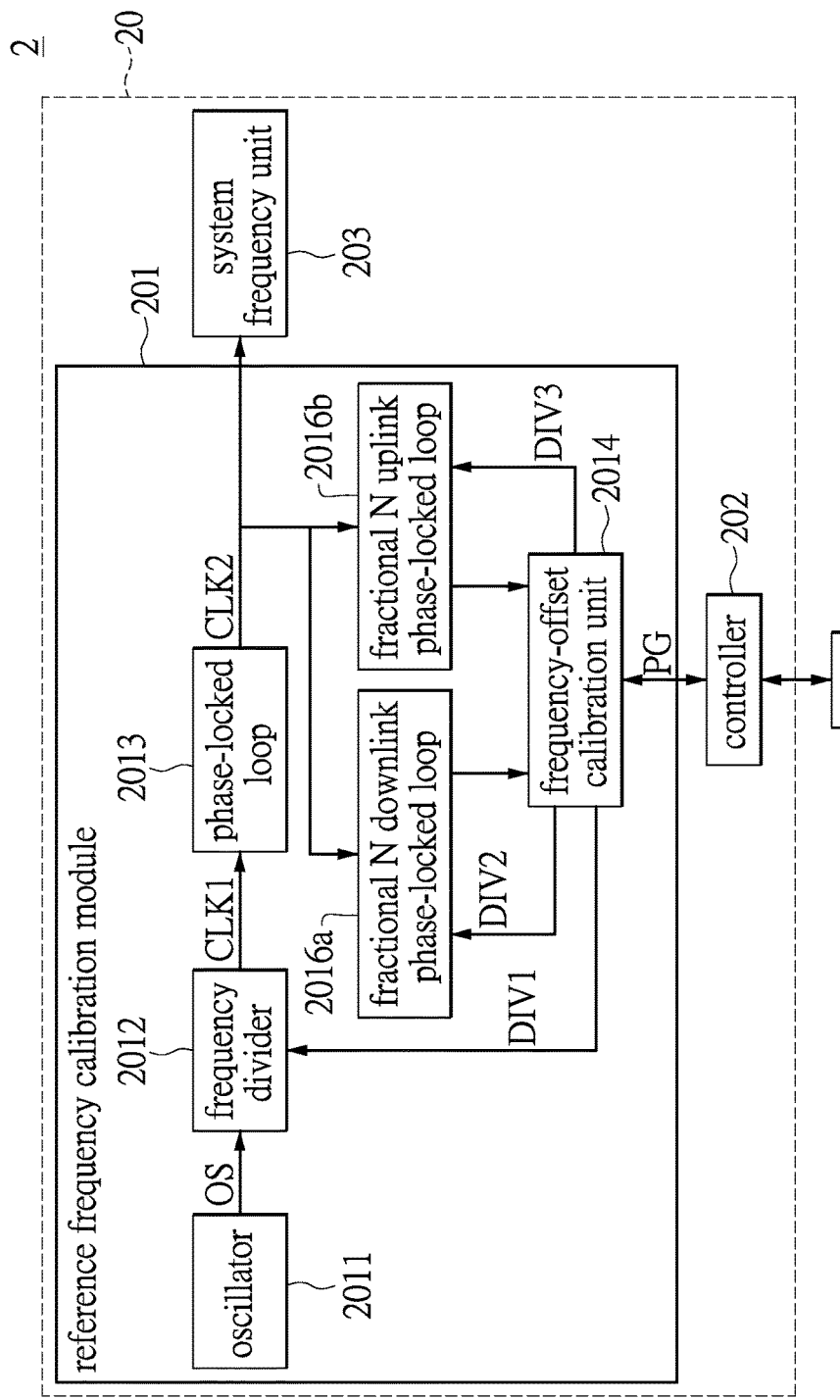
FIG. 4 is a diagram of a reference frequency calibration system of another embodiment according to the present disclosure.

Successively, other embodiments of the present disclosure are illustrated as following. Please refer to FIG. 4, FIG. 4 is a diagram of a reference frequency calibration system of another embodiment according to the present disclosure. The reference frequency calibration system 2 includes an electronic apparatus 20 and a host 21. The electronic apparatus 20 includes a reference frequency calibration module 201, a physical controller 202 and a system frequency unit 203. The reference frequency calibration module 201 includes an oscillator 2011, a frequency divider 2012, a phase-locked loop 2013, a frequency-offset calibration unit 2014, a fractional N downlink phase-locked loop 2016a, and a fractional N uplink phase-locked loop 2016b. The physical controller 202 couples to the reference frequency calibration module 201, and the reference frequency calibration module 201 couples to the system frequency unit 203. The frequency divider 2012 couples to the oscillator 2011. The frequency divider 2012, the fractional N downlink phase-locked loop 2016a, and the fractional N uplink phase-locked loop 2016b couple to the phase-locked loop 2013. The fractional N downlink phase-locked loop 2016a, the fractional N uplink phase-locked loop 2016b and the frequency divider 2012 couple to the frequency-offset calibration unit 2014. The difference between the embodiment of FIG. 4 and the embodiment of FIG. 1 is that the fractional N downlink phase-locked loop 2016a or the fractional N uplink phase-locked loop 2016b couple between the phase-locked loop 2013 and the frequency-offset calibration unit 2014, further the inside components of the frequency-offset calibration unit 2014 is different from the inside components of the frequency-offset calibration unit 1014. The functions of the fractional N downlink phase-locked loop 2016a and the fractional N uplink phase-locked loop 2016b are speed controller to fine turning the uplink or downlink speed for the memory pointers to avoid memory overflow or underflow. Moreover, the reading speed or writing speed of memory is utilized to determine the division parameter for calibration in the embodiment of the present disclosure.

Figure 5:
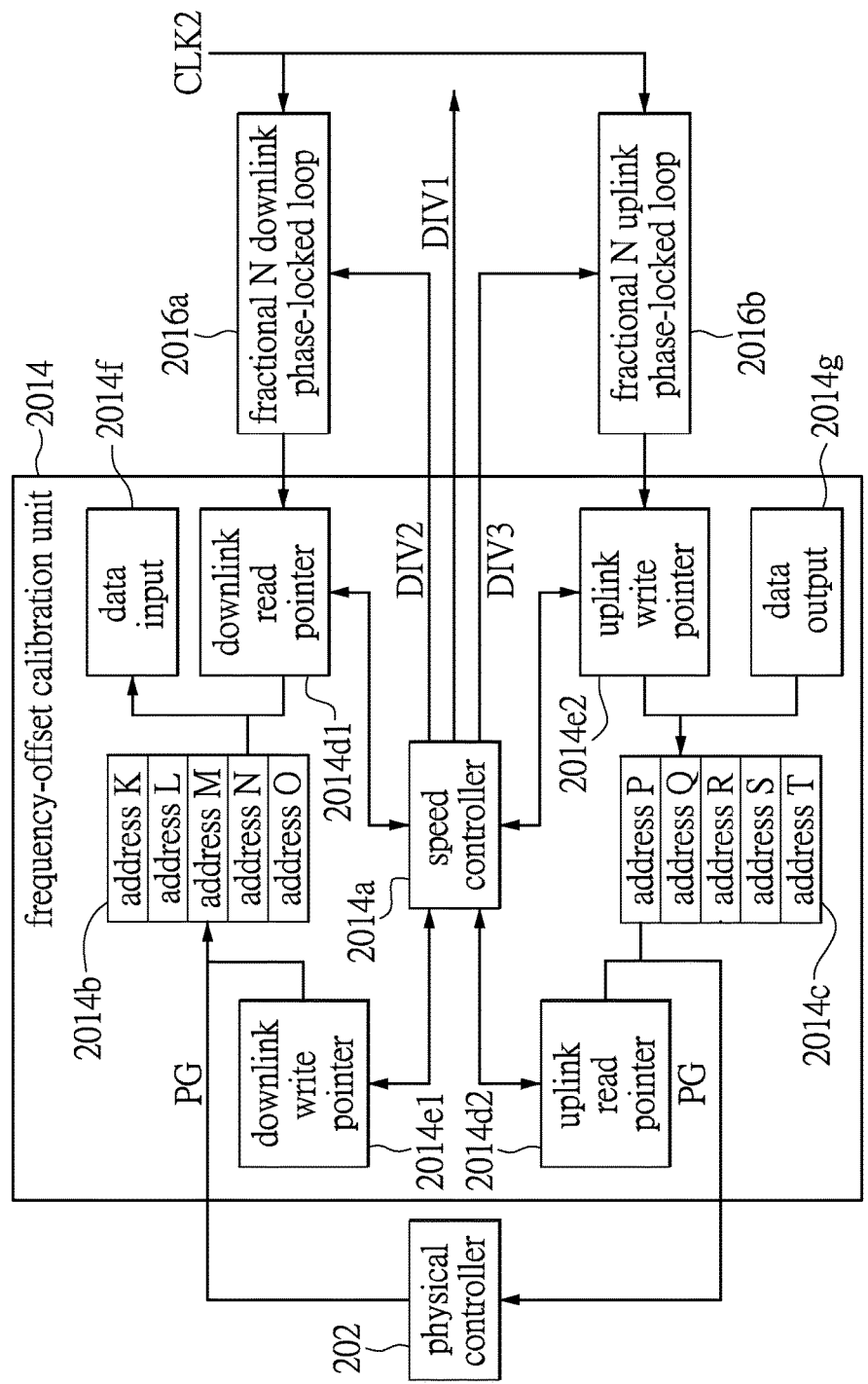
FIG. 5 is a detailed diagram of a frequency-offset calibration unit of another embodiment according to the present disclosure.

Please refer to FIG. 5 in conjunction with FIG. 4, FIG. 5 is a detail diagram of a frequency-offset calibration unit of another embodiment according to the present disclosure. The frequency-offset calibration unit 2014 includes a speed controller 2014a, a downlink memory 2014b, an uplink memory 2014c, a downlink read pointer 2014d1, a downlink read pointer 2014d2, a downlink write pointer 2014e1, a uplink read pointer 2014d2, a uplink write pointer 2014e2, a data input 2014f, and a data output 2014g. The downlink read pointer 2014d1, the uplink read pointer 2014d2, and the downlink write pointer 2014e1, the uplink write pointer 2014e2 couple to the speed controller 2014a. The downlink write pointer 2014e1, the downlink read pointer 2014d1, and the data input 2014f couple to the downlink memory 2014b. The uplink write pointer 2014e2, the uplink read pointer 2014d2, and the data output 2014g couple to the uplink memory 2014c.

The downlink memory 2014b and the uplink memory 2014c are configured to temporarily store the transmission data PG. There is merely shown one downlink memory 2014b and one uplink memory 2014c in the embodiment, however, the present disclosure is not limited the number of the memory thereto. The downlink write pointer 2014e1 with the address M or the uplink write pointer 2014e2 with the address Q is configured to point a free address of the downlink memory 2014b or the uplink memory 2014c to write the transmission data PG. Additionally, the downlink read pointer 2014d1 with the address N or the uplink read pointer with address P is configured to point a reading address of the downlink memory 2014b or the uplink memory 2014c to read the transmission data PG first written. In other words, the downlink memory 2014b and the uplink memories 2014c in the embodiment of the present disclosure are the first-in-first-out (FIFO) access memory.

The speed controller 2014a including suitable logic, circuitry, and/or code, is configured to detect a reading speed or a writing speed of a transmission data PG in the downlink memory 2014b or the uplink memories 2014c. The first division parameter DIV1 is generated when the reading speed of the transmission data PG is not equal to the writing speed of the transmission data PG in the power on initial state or large frequency deviation between system and its communication host.

The physical controller 202 utilizes the downlink memory 2014b to transmit the downlink data. The downlink data can be written into the downlink memory 2014b from the physical controller 202 by the write pointer 2014e, and the downlink data can be readout from the downlink memory 2014b to the data input 2014f by the read pointer 2014d. While the speed controller 2014a detects the reading speed of the downlink data is greater than the writing speed of the downlink data, that is, the frequency of the host 21 is smaller than the frequency of the electronic apparatus 20. Then the first division parameter DIV1 for reducing the first reference frequency of the first clock signal CLK1 is generated; while the speed controller 2014a detects the reading speed of the downlink data is less than the writing speed of the downlink data, that is, the frequency of the host 21 is greater than the frequency of the electronic apparatus 20. Then the first division parameter DIV1 for raising the first reference frequency of the first clock signal CLK1 is generated. In another embodiment, the physical controller 202 can utilize the uplink memory 2014c to transmit the uplink data. The uplink data can be uploaded from the data output 2014g to the uplink memory 2014c by the uplink write pointer 2014e2, and the uplink data can be readout from the uplink memory 2014c to the physical controller 202 by the uplink read pointer 2014d2. While the speed controller 2014a detects the reading speed of the uplink data is greater than the writing speed of the uplink data, the first division parameter DIV1 for raising the first reference frequency of the first clock signal CLK1 is generated; while the speed controller 2014a detects the reading speed of the uplink data is less than the writing speed of the uplink data. Then the first division parameter DIV1 for reducing the first reference frequency of the first clock signal CLK1 is generated.

Figure 6:
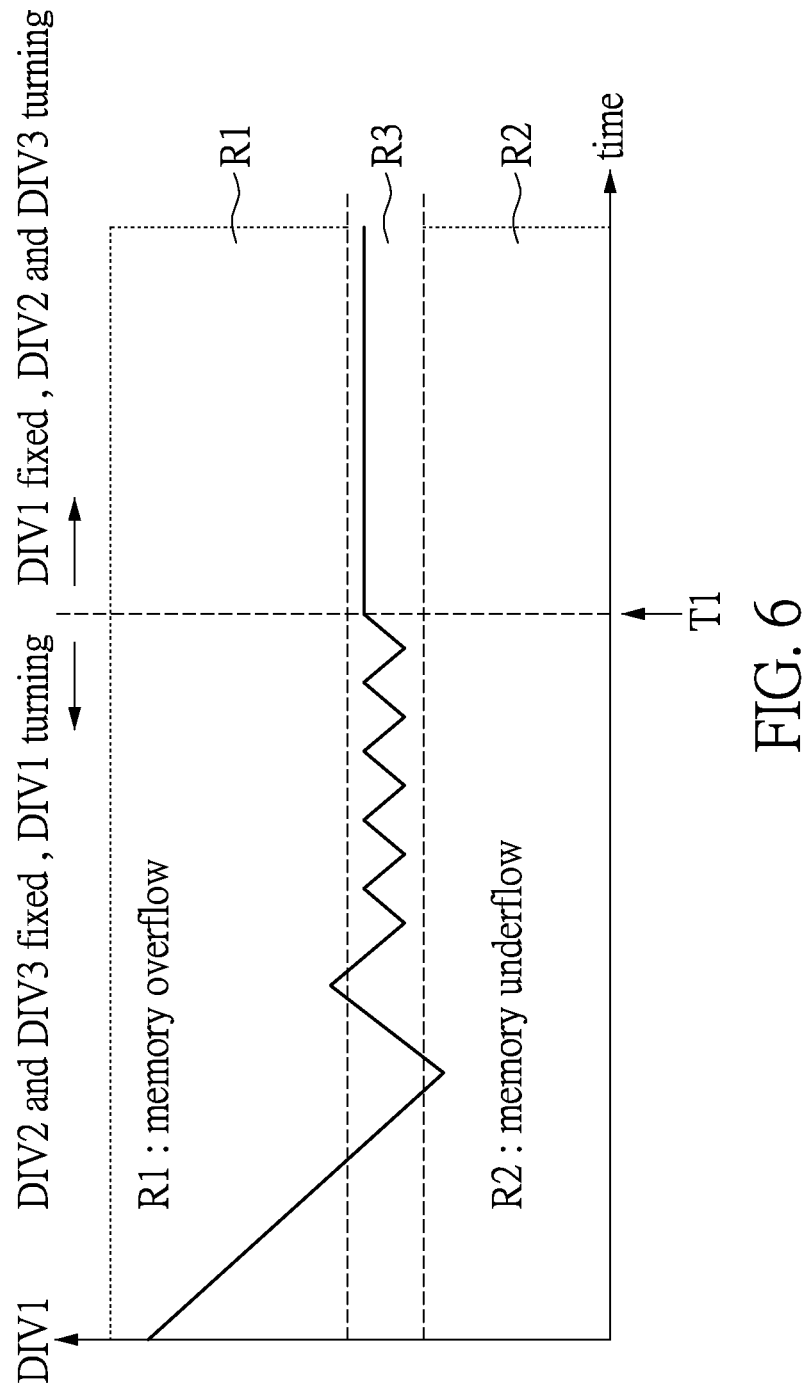
FIG. 6 is a diagram of a control of a first division parameter of another embodiment according to the present disclosure.

Please refer to FIG. 6, FIG. 6 is a diagram of a control of a first division parameter of the other embodiment according to the present disclosure. The downlink memory 2014b is illustrated as following. The time before time T1 as shown in FIG. 6, due to the second reference frequency of the second clock signal CLK2 being too slow causing the data of the downlink memory 2014b to move slowly, thus the downlink memory 2014b appears as writing overflow and the value of the first division parameter DIV1 stays in the region R1. In other words, such as above said that the speed controller 2014a detects the reading speed of the downlink data is less than the writing speed of the downlink data. Therefore, the speed controller 2014a reduces the value of the first division parameter DIV1 to raise the first reference frequency of the first clock signal CLK1. However, if the speed controller 2014a reduces the value of the first reference frequency of the first clock signal CLK1 too much, the downlink memory 2014b appears writing underflow and then the value of the first division parameter DIV1 stays in the region R2. Therefore, the speed controller 2014a may control the writing of the downlink memory 2014b at all times to regulate the value of the first division parameter DIV1 in the region R3.

Furthermore, the speed controller 2014a fixedly outputs the first division parameter DIV1 when the reading speed of the downlink data is close to the writing speed of the downlink data, and the speed controller 2014a generates a second division parameter DIV2 controlling the fractional N downlink phase-locked loop 2016a to regulate the reading speed of the downlink read pointer 2014d1 to achieve a dynamic balance between the reading speed of the downlink data and the writing speed of the downlink data; the speed controller 2014a fixedly outputs the first division parameter DIV1 when the reading speed of the uplink data is close to the writing speed of the uplink data, and the speed controller 2014a generates a third division parameter DIV3 controlling the fractional N uplink phase-locked loop 2016b to regulate the reading speed of the uplink writing pointer 2014e2 to achieve the dynamic balance between the reading speed of the uplink data and the writing speed of the uplink data. Shown as in FIG. 6, the downlink memory 2014b may not cause the writing overflow or writing underflow when closing to the time T1. Thus, the speed controller 2014a fixing the first division parameter DIV1 expresses that the second reference frequency of the second clock signal CLK2 is most close to the external reference frequency in reality. Actually the reference frequencies of the electronic apparatus 20 and the host 21 are impossible to be maintained consistent, the downlink memory 2014b (or the uplink memory 2014c) still appears overflow or underflow after the speed controller 2014a fixedly outputs the first division parameter DIV1 for a period. The embodiment of the present disclosure can avoid the overflow or underflow by performing the fine-tuning of the second division parameter DIV2 and the third division parameter DIV3.

In other words, the purpose of the first division parameter DIV1 is to make a minimum frequency error between electronic apparatus 20 and the host 21. If the minimum frequency error is reached, the value of the first division parameter DIV1 may be fixed. The fractional N downlink phase-locked loop 2016a with the second clock signal CLK2 takes over the controlling job for downlink read pointer 2014d1. Also, the fractional N uplink phase-locked loop 2016b with the third clock signal CLK3 takes over the controlling job for uplink write pointer 2014e2. The speed controller generates the second division parameter DIV2 and the third division parameter DIV3 according the reading and writing speed of the memories (e.g., downlink memory 2014b or uplink memory 2014c). The generations of the second division parameter DIV2 and the third division parameter DIV3 are similar to the generation of the first division parameter DIV1 as mention above.

It is worth to note, the frequency-offset calibration unit 2014 further can predetermine the maximum frequency-offset value for the second division parameter DIV2 and the third division parameter DIV3. The offsets of the second division parameter DIV2 and the third division parameter DIV3 exceeding the maximum frequency-offset value expresses that the system frequency offsets too much. At this time, the first division parameter DIV1 may be re-regulated. Therefore, the reference frequency calibration module 201 can control the system reference frequency and the reality frequency in the margin of error at all times.

To sum up, the reference frequency calibration module and the apparatus provided by the present disclosure makes it unnecessary to utilize the external reference frequency to be the clock criterion of the operating system. More specifically, the embodiment of the present disclosure utilizes an adjusted frequency divider to regulate an output signal of oscillated circuit. Thus, comparing with the traditional clock reference frequency module using the passive crystal component or the active oscillator, the embodiment of the present disclosure can utilize the oscillator circuit produced by the complementary metal oxide semiconductor (CMOS), to effectively save the external component, and reduce the circuit area and the cost thereof.

Additionally, the embodiment of the present disclosure not only refers to start of frame (SOF) or known data length in transmission process to be the calibration reference signal, but also bases on the reading/writing speed of memory, to calibrate the reference signal. Therefore, the embodiment of the present disclosure can provide the frequency-offset operating within the required margin of error, and the frequency-offset does not generate much difference oscillating frequency although the transmission rate of the host and the transmission rate of the physical controller are different, so as to maintain the characteristic of circuit.

It is worth noting that the embodiment of the present disclosure performs fine-tuning for reading/writing the downlink or uplink data by the fractional N divider, to reduce the clock frequency moving caused from the frequency calibration, and avoiding overflow or underflow at the buffer memory, to raise the stability in data transmission.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A reference frequency calibration module, comprising:
an oscillator, configured for operatively generating an oscillating signal having an oscillating frequency;
a frequency divider, coupling to the oscillator, configured for calculating the oscillating signal having the oscillating frequency by a first division parameter to generate a first clock signal having a first reference frequency;
a phase-locked loop, coupling to the frequency divider, configured for operatively generating a second clock signal having a second reference frequency according to the first clock signal; and a frequency-offset calibration circuit, coupling to the frequency divider and the phase-locked loop, configured for sampling a length of a predetermined packet by the second clock signal to generate the first division parameter;

wherein if the length of the predetermined packet sampled by the frequency-offset calibration circuit is greater than a predetermined value, the frequency-offset calibration circuit generates the first division parameter for reducing the first reference frequency of the first clock signal; if the length of the predetermined packet sampled by the frequency-offset calibration circuit is less than the predetermined value, the frequency-offset calibration circuit generates the first division parameter for raising the first reference frequency of the first clock signal.

2. The reference frequency calibration module according to claim 1, wherein the frequency-offset calibration circuit comprises:
   a packet detection circuit, configured for detecting the predetermined packet;
   a counting circuit, coupling to the packet detection circuit, configured for sampling the length of the predetermined packet by the second clock signal; and
   an offset calculation circuit, coupling to the counting circuit, configured for operatively generating the first division parameter when the length of the predetermined packet sampled by the counting circuit is not equal to the predetermined value.

3. The reference frequency calibration module according to claim 1, wherein the frequency divider is a fractional N divider.

4. A reference frequency calibration module, comprising:
   an oscillator, configured for operatively generating an oscillating signal having an oscillating frequency;
   a frequency divider, coupling to the oscillator, configured for calculating the oscillating signal having the oscillating frequency by a first division parameter to generate a first clock signal having a first reference frequency;
   a phase-locked loop, coupling to the frequency divider, configured for operatively generating a second clock signal having a second reference frequency according to the first clock signal; and
   a frequency-offset calibration circuit, coupling to the frequency divider and the phase-locked loop, configured for operatively generating the first division parameter according to the second clock signal;
   wherein the frequency-offset calibration circuit further comprises:
   a speed control circuit, configured for detecting a reading speed or a writing speed of a transmission data;
   wherein the first division parameter is generated when the reading speed of the transmission data is not equal to the writing speed of the transmission data.

5. The reference frequency calibration module according to claim 4, wherein the transmission data is a downlink data, while the speed control circuit detects the reading speed of the downlink data is greater than the writing speed of the downlink data, the first division parameter for reducing the first reference frequency of the first clock signal is generated; while the speed control circuit detects the reading speed of the downlink data is less than the writing speed of the downlink data, the first division parameter for raising the first reference frequency of the first clock signal is generated.

6. The reference frequency calibration module according to claim 5, comprising:
   a fractional N downlink phase-locked loop, coupling between the phase-locked loop and the frequency-offset calibration circuit, configured for fixedly outputting the first division parameter when the reading speed of the downlink data is close to the writing speed of the downlink data;
   wherein the speed control circuit generates a second division parameter controlling the fractional N downlink phase-locked loop to regulate the reading speed to achieve a dynamic balance between the reading speed of the downlink data and the writing speed of the downlink data.

7. The reference frequency calibration module according to claim 4, wherein the transmission data is a uplink data, while the speed control circuit detects the reading speed of the uplink data is greater than the writing speed of the uplink data, the first division parameter for raising the first reference frequency of the first clock signal is generated; while the speed control circuit detects the reading speed of the uplink data is less than the writing speed of the uplink data, the first division parameter for reducing the first reference frequency of the first clock signal is generated.

8. The reference frequency calibration module according to claim 7, comprising:
   a fractional N uplink phase-locked loop, coupling between the phase-locked loop and the frequency-offset calibration circuit, configured for fixedly outputting the first division parameter when the reading speed of the uplink data is close to the writing speed of the uplink data;
   wherein the speed control circuit generates a third division parameter controlling the fractional N uplink phase-locked loop to regulate the writing speed to achieve a dynamic balance between the reading speed of the uplink data and the writing speed of the uplink data.

9. The reference frequency calibration module according to claim 4, wherein the frequency-offset calibration circuit comprises:
   at least one memory, configured for temporarily storing the transmission data;
   a read pointer, coupling to the at least one memory, configured for pointing a storing address of the at least one memory to read the transmission data first written; and
   a write pointer, coupling to the at least one memory, configured for pointing a free address of the at least one memory to write the transmission data.

10. The reference frequency calibration module according to claim 4, wherein the frequency divider is a fractional N divider.

11. An electronic apparatus, comprising:
   a reference frequency calibration module, comprising:
   an oscillator, configured for operatively generating an oscillating signal having an oscillating frequency;
   a frequency divider, coupling to the oscillator, configured for calculating the oscillating signal having the oscillating frequency by a first division parameter to generate a first clock signal having a first reference frequency;
   a phase-locked loop, coupling to the frequency divider, configured for operatively generating a second clock signal having a second reference frequency according to the first clock signal; and a frequency-offset calibration circuit, coupling to the frequency divider and the phase-locked loop, configured for sampling a length of a predetermined packet by the second clock signal to generate the first division parameter; and a system frequency circuit, coupling to the reference frequency calibration module, configured for performing a signal synchronization according to the second reference frequency having the second clock signal outputted from the reference frequency calibration module;

wherein if the length of the predetermined packet sampled by the frequency-offset calibration circuit is greater than a predetermined value, the frequency-offset calibration circuit generates the first division parameter for reducing the first reference frequency of the first clock signal; if the length of the predetermined packet sampled by the frequency-offset calibration circuit is less than the predetermined value, the frequency-offset calibration circuit generates the first division parameter for raising the first reference frequency of the first clock signal.

12. The electronic apparatus according to claim 11, wherein the frequency-offset calibration circuit comprises:
a packet detection circuit, configured for detecting the predetermined packet;
a counting circuit, coupling to the packet detection circuit, configured for sampling the length of the predetermined packet by the second clock signal; and
an offset calculation circuit, coupling to the counting circuit, configured for operatively generating the first division parameter when the length of the predetermined packet sampled by the counting circuit is not equal to the predetermined value.

13. An electronic apparatus, comprising:
a reference frequency calibration module, comprising:
an oscillator, configured for operatively generating an oscillating signal having an oscillating frequency;
a frequency divider, coupling to the oscillator, configured for calculating the oscillating signal having the oscillating frequency by a first division parameter to generate a first clock signal having a first reference frequency;
a phase-locked loop, coupling to the frequency divider, configured for operatively generating a second clock signal having a second reference frequency according to the first clock signal; and
a frequency-offset calibration circuit, coupling to the frequency divider and the phase-locked loop, configured for operatively generating the first division parameter according to the second clock signal; and
a system frequency circuit, coupling to the reference frequency calibration module, configured for performing a signal synchronization according to the second reference frequency having the second clock signal outputted from the reference frequency calibration module;

wherein the frequency-offset calibration circuit further comprises:
a speed control circuit, configured for detecting a reading speed or a writing speed of a transmission data;
wherein the first division parameter is generated when the reading speed of the transmission data is not equal to the writing speed of the transmission data.

14. The electronic apparatus according to claim 13, wherein the transmission data is a downlink data, while the speed control circuit detects the reading speed of the downlink data is greater than the writing speed of the downlink data, the first division parameter for reducing the first reference frequency of the first clock signal is generated; while the speed control circuit detects the reading speed of the downlink data is less than the writing speed of the downlink data, the first division parameter for raising the first reference frequency of the first clock signal is generated.

15. The electronic apparatus according to claim 14, comprising:
a fractional N downlink phase-locked loop, coupling between the phase-locked loop and the frequency-offset calibration circuit, configured for fixedly outputting the first division parameter when the reading speed of the downlink data is close to the writing speed of the downlink data;
wherein the speed control circuit generates a second division parameter controlling the fractional N downlink phase-locked loop to regulate the reading speed to achieve a dynamic balance between the reading speed of the downlink data and the writing speed of the downlink data.

16. The electronic apparatus according to claim 13, wherein the transmission data is a uplink data, while the speed control circuit detects the reading speed of the uplink data is greater than the writing speed of the uplink data, the first division parameter for raising the first reference frequency of the first clock signal is generated; while the speed control circuit detects the reading speed of the uplink data is less than the writing speed of the uplink data, the first division parameter for reducing the first reference frequency of the first clock signal is generated.

17. The electronic apparatus according to claim 16, comprising:
a fractional N uplink phase-locked loop, coupling to the phase-locked loop and the frequency-offset calibration circuit, configured for fixedly outputting the first division parameter when the reading speed of the uplink data is close to the writing speed of the uplink data;
wherein the speed control circuit generates a third division parameter controlling the fractional N uplink phase-locked loop to regulate the writing speed to achieve a dynamic balance between the reading speed of the uplink data and the writing speed of the uplink data.

* * * * *